United States Patent [19]

Yawata et al.

[11] Patent Number: 5,015,593
[45] Date of Patent: May 14, 1991

[54] METHOD OF MANUFACTURING SEMICONDUCTOR DEVICE

[75] Inventors: Shigeo Yawata; Kazuhisa Shibao, both of Hyogo; Shun-ichi Hiraki, Nagareyama, all of Japan

[73] Assignee: Kabushiki Kaisha Toshiba, Kawasaki, Japan

[21] Appl. No.: 522,787

[22] Filed: May 14, 1990

[30] Foreign Application Priority Data

May 15, 1989 [JP] Japan .................. 1-121205

[51] Int. Cl.$^5$ ........................... H01L 21/265
[52] U.S. Cl. ........................... 437/25; 437/41; 437/247; 437/968; 148/DIG. 78
[58] Field of Search ........... 437/25, 952, 968, 983; 148/DIG. 122, DIG. 78

[56] References Cited

U.S. PATENT DOCUMENTS 4,055,444  10/1977  Rao ........................... 437/968
4,640,721  2/1987   Uehara et al. ............. 437/968

FOREIGN PATENT DOCUMENTS 0033840  4/1981  Japan ........................... 437/25

OTHER PUBLICATIONS

Ghandhi, S. K.; VLSI Fabrication Principles, 1983, pp. 385–388.
IBM Technical Disclosure Bulletin, vol. 21, No. 4, September 1978, pp. 1434–1435; "Emitter Ion Implantation and Diffusion Process", J. L. Forneris et al.
Journal of the Electrochemical Society, vol. 124, No. 2, Feb. 1977, pp. 276–279; "The Diffusion of Implanted Boron in Silicon", R. P. Ricco et al.

*Primary Examiner*—Brian E. Hearn
*Assistant Examiner*—Chandra Chaudhari
*Attorney, Agent, or Firm*—Finnegan, Henderson, Farabow, Garrett and Dunner

[57] ABSTRACT

In order to eliminate unwanted crystal defects generated by an ion implantation, a semiconductor substrate or an epitaxial layer, which is selectively subjected to an impurity ion implantation, is heat-treated in an inert gas atmosphere at 850° to 1050° C. to recrystallize the implanted region. Thereafter, the semiconductor substrate is heat-treated at 900° to 1250° C. in an atmosphere containing oxygen. For eliminating abnormal growth of grain boundaries in a polycrystalline semiconductor layer deposited on an insulating film the semiconductor layer is heat-treated at 900° to 1100° C. in an atmosphere containing oxygen. By applying at least one of these processes to usual fabrication methods, semiconductor devices with high reliabilty such as power MOSFETs will be provided.

7 Claims, 3 Drawing Sheets

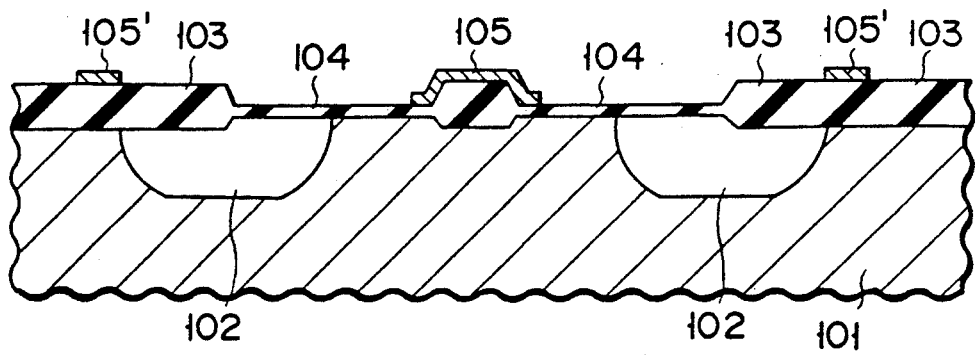
F I G. 1A
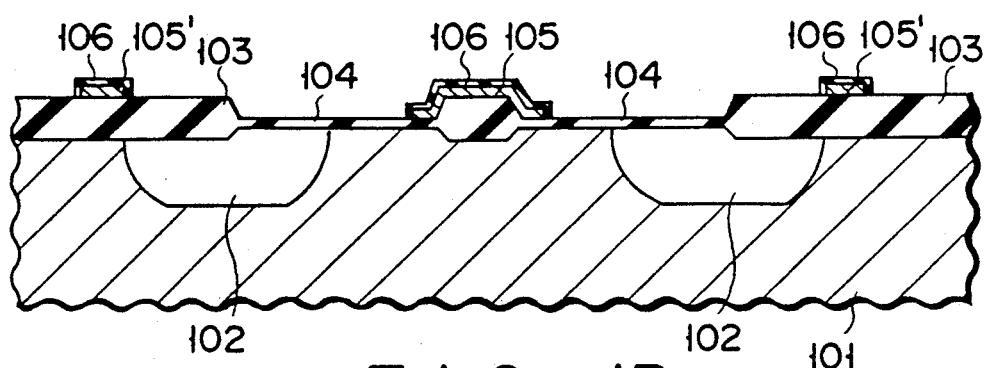
F I G. 1B
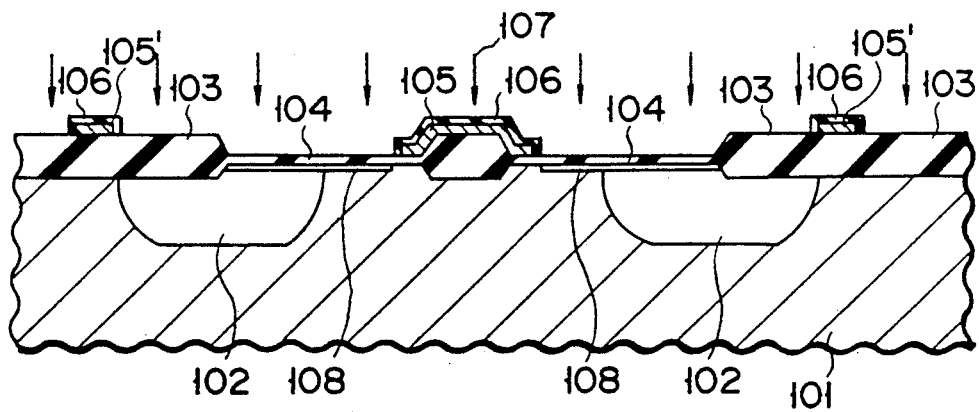
F I G. 1C
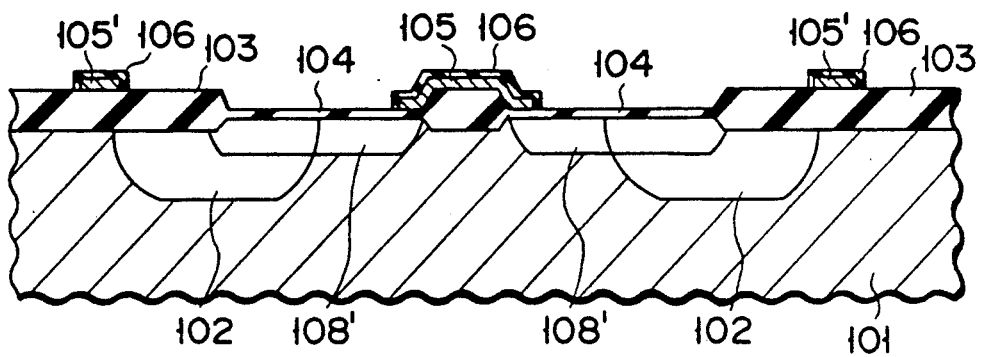
F I G. 1D

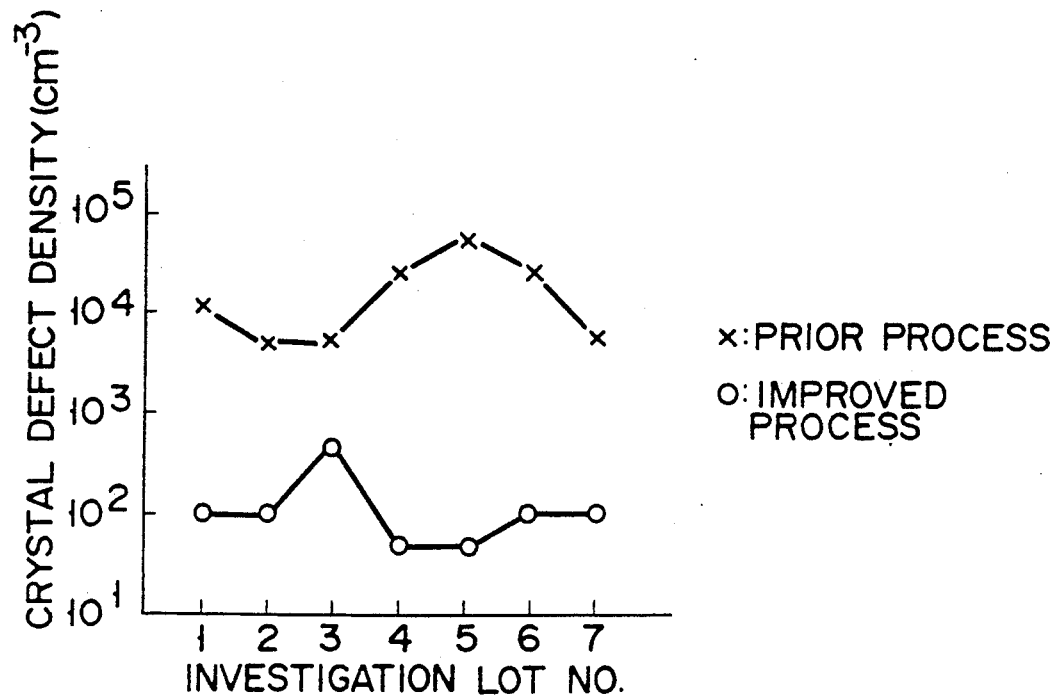
F I G. 3
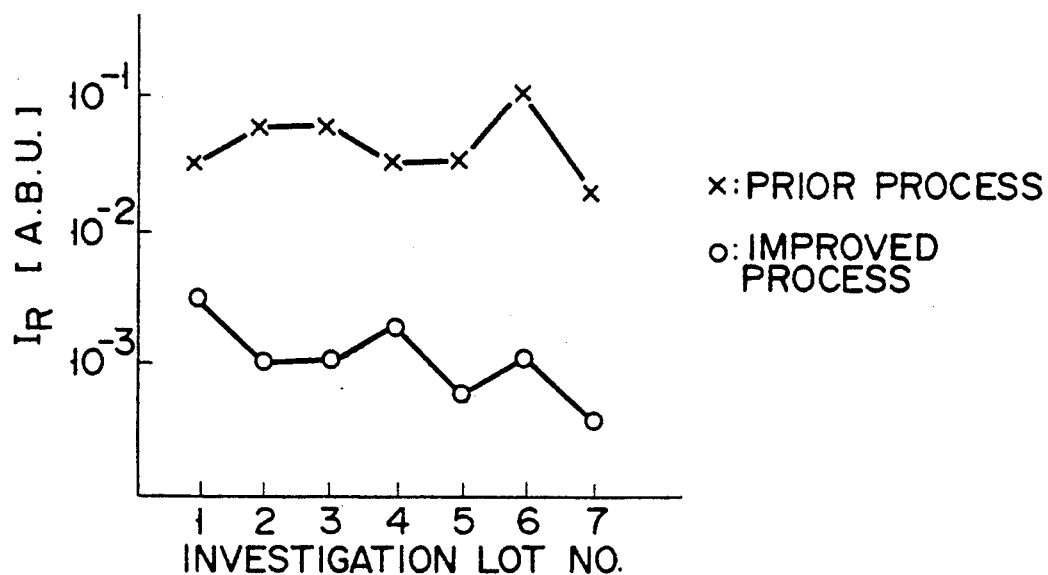
F I G. 4

METHOD OF MANUFACTURING SEMICONDUCTOR DEVICE

BACKGROUND OF THE INVENTION

1. Field of the Invention

The present invention relates to a method of manufacturing a semiconductor device, and more particularly to a method of manufacturing a semiconductor device including at least one of processes containing a process for heat-treating an impurity region provided by implanting impurity ions into a semiconductor substrate and a process for activating a polycrystalline semiconductor layer deposited on an insulation film.

2. Description of the Related Art

When a semiconductor region of a predetermined conductivity type is formed in an epitaxial layer or a semiconductor substrate of single crystal by an ion-implantation technique, the epitaxial layer is subjected to damage, and the ion-implanted region becomes amorphous. For diffusing the implanted impurity into the epitaxial layer, a heat treatment is usually performed in a nitrogen gas atmosphere at about 1200° C. for three hours. During this treatment, there occurs a damage recovery phenomenon wherein the amorphous region is restored to a single crystal state. However, inventors have found that since the heat treatment requires a high temperature and a long time, high density crystal defects are generated in the epitaxial layer or semiconductor substrate, depending upon unwanted nuclei caused by the damage due to the ion-implantation and by contamination in the manufacturing process. The crystal defects may decrease the breakdown voltage of semiconductor devices such as power MOSFETs (power MOS field effect transistors), or may increase an undesirable leakage current.

A polycrystalline semiconductor layer, such as a polysilicon layer provided on an insulation film, has been used as an electrode or an interconnection layer in various semiconductor devices including integrated circuits. Though, the polysilicon layer has been activated in a nitrogen atmosphere, the grain boundaries of the polysiicon layer are abnormally grown according to conditions of treating time and temperature. The abnormally-grown grain boundaries are very easily oxidized and, for example, they are easily oxidized in a thermal diffusion process. When the polysilicon layer having the oxidized grain boundaries is subjected to etching after the activation treatment, the grain boundaries are removed by an etchant and unwanted pin-holes are formed in the insulation film provided under the polysilicon layer. In a MOS semiconductor device, when the polysilicon layer is used as a gate electrode, pinholes are provided in an underlying gate oxide film, thereby bringing unwanted insulation deterioration between the gate electrode and the source or drain region.

At any rate, the problems described above may reduce the reliability and the yield of semiconductor devices.

SUMMARY OF THE INVENTION

Accordingly, it is an object of the present invention to provide a method of manufacturing a semiconductor device for eliminating crystal defects caused by an impurity ion implantation into an epitaxial layer or a semiconductor substrate.

Another object of the present invention is to provide a method of manufacturing a semiconductor device for heat-treating polycrystalline semiconductor layers so as to eliminate abnormal growth of grain boundaries and to provide uniform and stable film quality.

Still another object of the present invention is to provide a method of manufacturing a semiconductor device whose reliability and yield are highly improved.

These objects of the present invention are attained by the following manufacturing processes.

For eliminating the crystal defects caused by the impurity ion implantation, a selectively ion-implanted semiconductor substrate or an epitaxial layer is heat-treated in an inert gas atmosphere at 850° to 1050° C. to recrystallize the ion-implanted region. The semiconductor substrate is then heat-treated in an atmosphere containing oxygen at 900° to 1250° C. to diffuse the implanted impurity thereinto.

For activating a polycrystalline semiconductor layer deposited on an insulation film of a semiconductor substrate, the polycrystalline semiconductor layer is patterned and heat-treated in an atmosphere containing oxygen at 900° to 1100° C.

To provide a semiconductor device with high reliability by heat-treating a polycrystalline semiconductor layer having no pin-holes but uniform and stable film quality and by eliminating crystal defects caused by the ion-implantation, after an insulation film is formed on a semiconductor substrate and a polycrystalline semiconductor layer is deposited on the insulation film, the polycrystalline semiconductor layer is patterned to a desired configuration, and the patterned layer is heat-treated in an atmosphere containing oxygen at 900° to 1100° C. A desired impurity is then implanted into a predetermined region of the semiconductor substrate through the insulation film, and the semiconductor substrate is heat-treated in an inert gas atmosphere at 850° to 1050° C. to recrystallize the implanted region. Thereafter, the semiconductor substrate is heat-treated in an atmosphere containing oxygen at 900° to 1250° C. to diffuse the implanted impurity thereinto.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIGS. 1A to 1D are sectional views showing manufacturing steps of a semiconductor device according to an embodiment of the present invention;

FIG. 3 is a graph in which the densities of crystal defects of semiconductor devices manufactured by the conventional method and by the method of the present invention are compared with each other every each of investigation lots; and FIG. 4 is a graph in which leak levels of semiconductor devices manufactured by the conventional method and by the method of the present invention are compared with each other every each of investigation lots.

DETAILED DESCRIPTION OF THE PREFERRED EMBODIMENT

Figure 2:
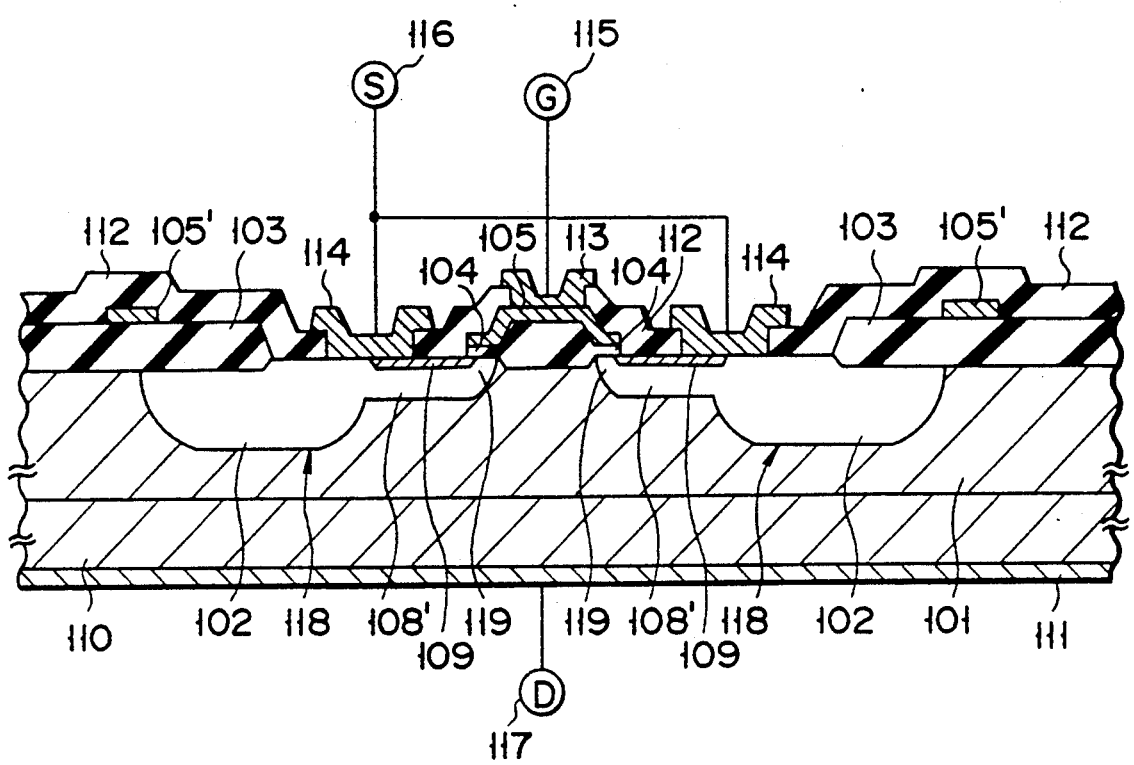
FIG. 2 is a sectional view showing a semiconductor device formed by the manufacturing steps shown in FIG. 1A to 1D.

One embodiment of the present invention applied to a method of manufacturing a power MOSFET (Metal Oxide Semiconductor Field Effect Transistor) will be described with reference to FIGS. 1A to 1D and FIG. 2.

As illustrated in FIG. 1A, in an n-type epitaxial layer 101 grown on an n+-type semiconductor substrate (not shown) having a high impurity concentration, a ring-shaped p+-type first well region 102 is provided by means of well-known techniques so as to interpose therebetween a thick insulation film which constitutes a gate portion. Similarly, a gate oxide film 104 having a thickness of 900 Å is formed by thermal oxidation on an element region isolated by a field oxide film 103. A polysilicon layer having a thickness of 5000 Å is then deposited over the oxide film formed on the substrate surface by means of LPCVD (Low Pressure Chemical Vapor Deposition) techniques. In this case, the deposition temperature range is from 600° to 650° C. The polysilicon layer is patterned to a desired configuration, using a photoresist film, and a gate electrode 105 of polysilicon is formed on both the thin gate oxide film and the thick insulation film which provide the gate portion. Polysilicon interconnection layers or gate electrodes 105' of other power MOSFETs (not shown) are provided at the same time.

As shown in FIG. 1B, the semiconductor substrate is heat-treated for 30 minutes in an atmosphere containing an oxygen gas at 900° to 1100° C., preferably at 1000° C. to activate polysilicon layers 105 and 105'. An oxide film 106 is formed on the surfaces of the polysilicon layers by the heat treatment. Since the polysilicon layers are activated by the heat treatment, abnormal grain boundaries, which bring unwanted pin-holes reaching the gate oxide film 104 in the gate electrode 105 of polysilicon, are prevented to provide uniform and stable film quality.

As shown in FIG. 1C, boron 107 of p-type impurity is ion-implanted into the n-type epitaxial layer 101 through the gate oxide film 104 with an acceleration voltage of 60 KeV and a dose of $2 \times 10^{14} cm^{-2}$ by a self-alignment method, using gate electrode 105 and field oxide film 103 as masks. An impurity implanted region 108 is formed in the epitaxial layer 101 by the ion implantation. In this region 108, the crystal structure of epitaxial layer 101 becomes amorphous.

As shown in FIG. 1D, the semiconductor substrate is heat-treated for one hour in an atmosphere of a nitrogen gas (15 l/min) at 850° to 1050° C., preferably at 1000° C. to single-crystallize the impurity implanted region 108 of the amorphous state. In this heat treatment, the nitrogen gas may be replaced with an inert gas containing no oxygen or a mixed gas of the inert gas and the nitrogen gas. Subsequently to the heat treatment, the temperature in a furnace is increased to 900° to 1250° C., preferably to 1200° C., and the atmosphere is changed to an atmosphere of a mixed gas of nitrogen gas (10 l/min) and oxygen gas (1.5 l/min). In this condition, the semiconductor substrate is heat-treated for three hours to diffuse the impurity from the region 108, thereby forming a p-type second well region 108'.

FIG. 2 shows a structure of a power MOSFET which is provided by applying well-known techniques to the semiconductor substrate formed through the manufacturing steps shown in FIGS. 1A to 1D.

As illustrated in FIG. 2, the n-type epitaxial layer 101 is provided on the n+-type semiconductor substrate 110 having the high impurity concentration. Epitaxial layer 101 includes a ring-shaped p-type region 118 having two well regions 102 and 108'. In p-type region 118, a ring-shaped n-type source region 109 is provided so as to define a channel region 119 of the power MOSFET. A source electrode 114, which is comprised of aluminum, is provided on a part of n-type source region 109 so as to overlap with a part of p+-type well region 102, and is connected to a source terminal 116. The polysilicon gate electrode 105 is provided on the channel region 119 within the p-type second well region 108' through gate oxide film 104. A gate terminal electrode 113, which is comprised of, e.g., aluminum is provided on the gate electrode 105 and connected to a gate terminal 115. Electrodes 114, 105 and 113 are insulated from one another by insulation film 112. Furthermore, the polysilicon interconnection layers provided on the field oxide film 103 or gate electrodes 105' of another power MOSFET (not shown) are covered with the insulation film 112. A drain electrode 111 is provided on the n+-type semiconductor substrate 110.

According to the semiconductor device manufactured by the method described above, the polysilicon gate electrode 105 or the polysilicon interconnection layers 105' shown in FIGS. 1A to 1D is activated in an atmosphere containing oxygen, thus no pin-holes may be formed to provide uniform and stable electrode layer. Therefore, the manufacturing yield is improved and the insulation deterioration between the gate and source regions is eliminated. Accordingly, semiconductor devices with high reliability can be achieved.

Since the semiconductor substrate is heat-treated in the nitrogen gas atmosphere prior to the impurity diffusion of the p-type second well region 108', the crystal defects due to the ion-implantation may be eliminated in the p-type second well region 108' formed in the epitaxial layer 101. The leak level may be thus lowered to increase the breakdown voltage of the semiconductor device. Accordingly, semiconductor device with high reliability can be obtained.

The advantages of the present invention will be described with reference to FIGS. 3 and 4.

FIG. 3 is a graph in which the densities of crystal defects of semiconductor devices manufactured by the conventional method and by the method of the present invention are compared with each other every each of investigation lots. FIG. 4 is a graph in which leak levels of semiconductor devices manufactured by the conventional method and by the method of the present invention are compared with each other every each of investigation lots.

These comparisons are intended to examine how a subtle difference in quality of silicon single-crystal in each of the lots affects the present invention.

As illustrated in FIG. 3, while the number of crystal defects is about $10^4$ per 1 $cm^2$ in each of lots 1 to 7 in the conventional method, the number is about $10^2$ per 1 $cm^2$ in the method according to the present invention. Even though there is a subtle difference in quality of single-crystal of silicon in each of the lots, the present invention is effective regardless of this difference.

As shown in FIG. 4, in each of lots 1 to 7, the leak level of the semiconductor devices according to the present invention is reduced 1/10 or less times that of the semiconductor devices manufactured by the conventional method. As is apparent from FIG. 3, this shows that a decrease in the density of crystal defects improves the leak level.

A method of manufacturing a power MOSFET has described above as a method of manufacturing a semiconductor device according to one embodiment of the present invention, but the present invention is not limited to the power MOSFET and can be clearly applicable to various types of semiconductor devices, such as semiconductor devices having polycrystalline semiconductor layers provided on insulation films, semiconductor devices having ion-implanted regions formed in an epitaxial layer or a semiconductor substrate, etc.

For activating the polysilicon layer, various investigations were carried out under conditions such that the amount of oxygen gas in a nitrogen gas base was used as a parameter and the amount of oxygen gas in an argon gas base was used as a parameter, while keeping the temperature range at 900° to 1100° C. As a result, it was turned out that the same effect as described in the above embodiment can be obtained if the oxidizing amount of polysilicon is 150 Å or more when the amount of oxidation of the polysilicon is converted into the thickness of an oxidation growth film of an n-type silicon substrate whose surface orientation is (100) and the resistivity is 0.5 to 1000 Ω·cm.

In the above embodiment, boron is used as an impurity which is ion-implanted into the semiconductor substrate. Even if phosphorus is used in place of the boron, the same effects can be obtained.

It is further understood by those skilled in the art that the foregoing description is a preferred embodiment of the disclosed methods and that various changes and modifications may be made in the invention without departing from the spirit and scope thereof.

What is claimed is:

1. A method of manufacturing a semiconductor device comprising the steps of:

forming an insulation film on a semiconductor substrate;

depositing a polycrystalline semiconductor layer on said insulation film;

patterning said polycrystalline semiconductor layer to a desired configuration;

heat-treating for activation of the patterned polycrystalline semiconductor layer in an atmosphere containing oxygen at 900° to 1100° C.;

ion-implanting a desired impurity into said semiconductor substrate through said insulation film;

heat-treating said semiconductor substrate in an inert gas atmosphere at 805° to 1050° C. to recrystallize the ion-implanted region of said semiconductor substrate; and heat-treating said semiconductor substrate in an atmosphere at 900° to 1250° C. to diffuse the implanted impurity thereinto.

2. The method according to claim 1, wherein said atmosphere for activation of the polycrystalline semiconductor layer is composed of a nitrogen gas containing oxygen.

3. The method according to claim 1, wherein said atmosphere for activation of the polycrystalline semiconductor layer is composed of an argon gas containing oxygen.

4. The method according to claim 1, wherein said inert gas atmosphere is composed of a nitrogen gas.

5. The method according to claim 1, wherein said inert gas atmosphere is composed of a mixed gas of a nitrogen gas and another inert gas.

6. The method according to claim 1, wherein the semiconductor device is comprised of a power MOSFET.

7. The method according to claim 1, wherein said atmosphere to diffuse the implanted impurity into said semiconductor substrate is composed of an inert gas atmosphere containing oxygen.

* * * * *